(12) United States Patent
Tooi et al.

(10) Patent No.: US 7,772,669 B2
(45) Date of Patent: Aug. 10, 2010

(54) SEMICONDUCTOR DEVICE HAVING AN IMPROVED STRUCTURE FOR HIGH WITHSTAND VOLTAGE

(75) Inventors: Shigeo Tooi, Tokyo (JP); Tetsujiro Tsunoda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 12 days.

(21) Appl. No.: 11/540,625

(22) Filed: Oct. 2, 2006

(65) Prior Publication Data

US 2007/0278672 A1 Dec. 6, 2007

(30) Foreign Application Priority Data

May 31, 2006 (JP) ............... 2006-150986

(51) Int. Cl.
*H01L 29/93* (2006.01)
(52) U.S. Cl. ............... 257/495; 257/490; 257/E29.012; 257/E29.009
(58) Field of Classification Search ................. 257/490, 257/495, E29.012, E29.009
See application file for complete search history.

(56) References Cited

U.S. PATENT DOCUMENTS 5,266,831 A 11/1993 Phipps et al.
5,304,831 A * 4/1994 Yilmaz et al. ............... 257/341
2004/0262678 A1* 12/2004 Nakazawa et al. .......... 257/330
2005/0161761 A1* 7/2005 Hatade ....................... 257/487

FOREIGN PATENT DOCUMENTS

| JP | 6-97439 | 4/1994 |
|---|---|---|
| JP | 6-283727 | 10/1994 |
| JP | 8-306911 | 11/1996 |
| JP | 2000-243978 | 9/2000 |
| JP | 2002-231944 | 8/2002 |
| JP | 2004-158817 | 6/2004 |

OTHER PUBLICATIONS

Machine Translation of JP-08-306911 by Kitahira et al.*

* cited by examiner

*Primary Examiner*—Kimberly D Nguyen
*Assistant Examiner*—Alexander Belousov
(74) *Attorney, Agent, or Firm*—Oblon, Spivak, McClelland, Maier & Neustadt, L.L.P.

(57) ABSTRACT

Second diffusion layers to be guard rings of a second conductivity type are formed on the major surface of a semiconductor substrate of a first conductivity type in a guard ring region. An insulating film is formed on these second diffusion layers. The semiconductor device has a structure wherein a conductive film is formed on the insulating film between adjacent electrodes among a first surface electrode, second surface electrodes, and a third surface electrode.

11 Claims, 7 Drawing Sheets

SEMICONDUCTOR DEVICE HAVING AN IMPROVED STRUCTURE FOR HIGH WITHSTAND VOLTAGE

BACKGROUND OF THE INVENTION

1. Field of the Invention

The present invention relates to a semiconductor device, and more specifically, to a semiconductor device that has surface electrodes of a multilayer structure and can maintain high withstand voltage.

2. Background Art

Figure 7:
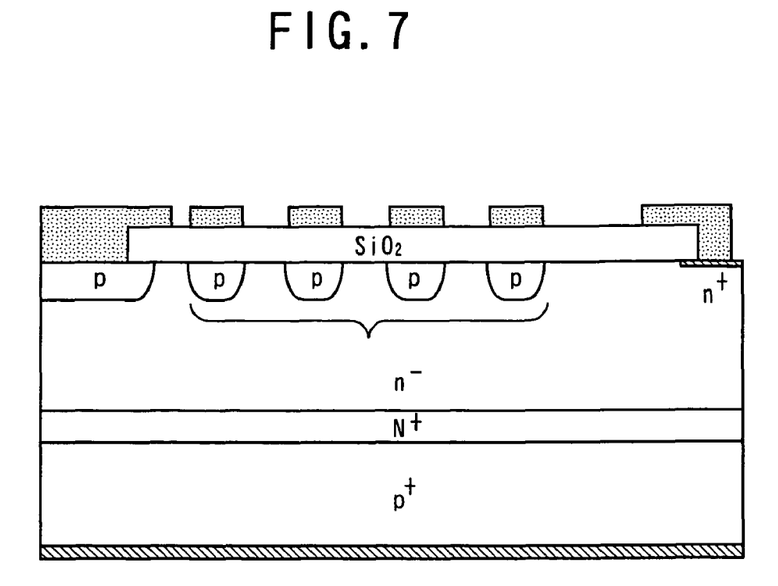
FIGS. 7 and 8 are cross sectional views of a conventional semiconductor chip.

Normally in a semiconductor device requiring high withstand voltage, a p-n junction referred to as a guard ring is disposed in the peripheral area of the device region as FIG. 7 shows. By such a structure, an electric field generated by voltage supply can be gradually relaxed toward the end portion of the semiconductor device. Thereby, even if a predetermined reverse direction voltage is supplied to the p-n junction, an avalanche breakdown due to electric field concentration can be prevented.

The above-described guard ring structure is effective to maintain high withstand voltage. However, since the region for forming guard rings in the peripheral area of the semiconductor device is required, the chip size is expanded.

Figure 8:
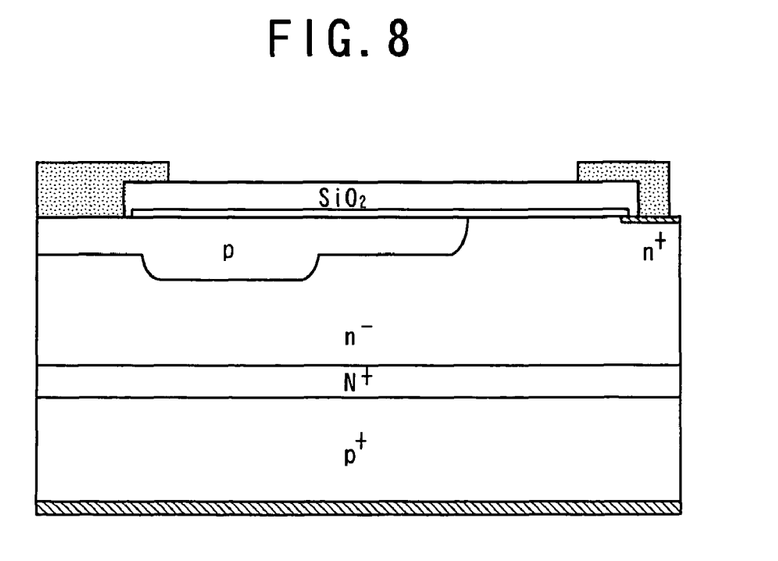

In Japanese Unexamined Patent Publication No. 6-97439, in order to avoid the expansion of chip size, a SIPOS (semi-insulating polycrystalline silicon) reduced surface field structure shown in FIG. 8 is disclosed.

In the above-described conventional structure shown in FIG. 7, in order to maintain a desired high withstand voltage, the chip size of a semiconductor chip is expanded, and chip costs are elevated. In the structure shown in FIG. 8, the manufacturing process is complicated, and chip costs are elevated. Specifically, in any of the above-described conventional art, there was a problem wherein chip costs are elevated to maintain a desired high withstand voltage.

SUMMARY OF THE INVENTION

The present invention has been developed to solve the above-described problems, and therefore it is an object of the present invention to provide a semiconductor device that is inexpensive, and can stably maintain high withstand voltage.

The above object is achieved by a semiconductor device that includes a semiconductor substrate of a first conductivity type, a device region formed on the major surface of said semiconductor substrate, a guard ring region formed on the major surface of said semiconductor substrate, and surrounding said device region, a first diffusion layer of a second conductivity type formed in said device region, a first electrode formed over said first diffusion layer, and connected to said first diffusion layer, at least one second diffusion layer of the second conductivity type formed in said guard ring region apart from said first diffusion layer, and surrounding said device region, an insulating film coating the upper surface of said second diffusion layer on said semiconductor substrate, whose one end contacts said first electrode, a second electrode formed on the upper surface of said insulating film facing said second diffusion layer, and a conductive layer formed on the upper surface of said insulating film between adjacent electrodes among said first electrode and said second electrode.

According to the present invention, a semiconductor device that is inexpensive, and can stably maintain high withstand voltage can be obtained.

Other features and advantages of the invention will be apparent from the following description taken in connection with the accompanying drawings.

DETAILED DESCRIPTION OF THE PREFERRED EMBODIMENTS

Embodiments of the present invention will be described below referring to the drawings. In the drawings, the same or equivalent parts will be denoted by the same reference numerals, and the description thereof will be simplified or omitted.

First Embodiment

Figure 1:
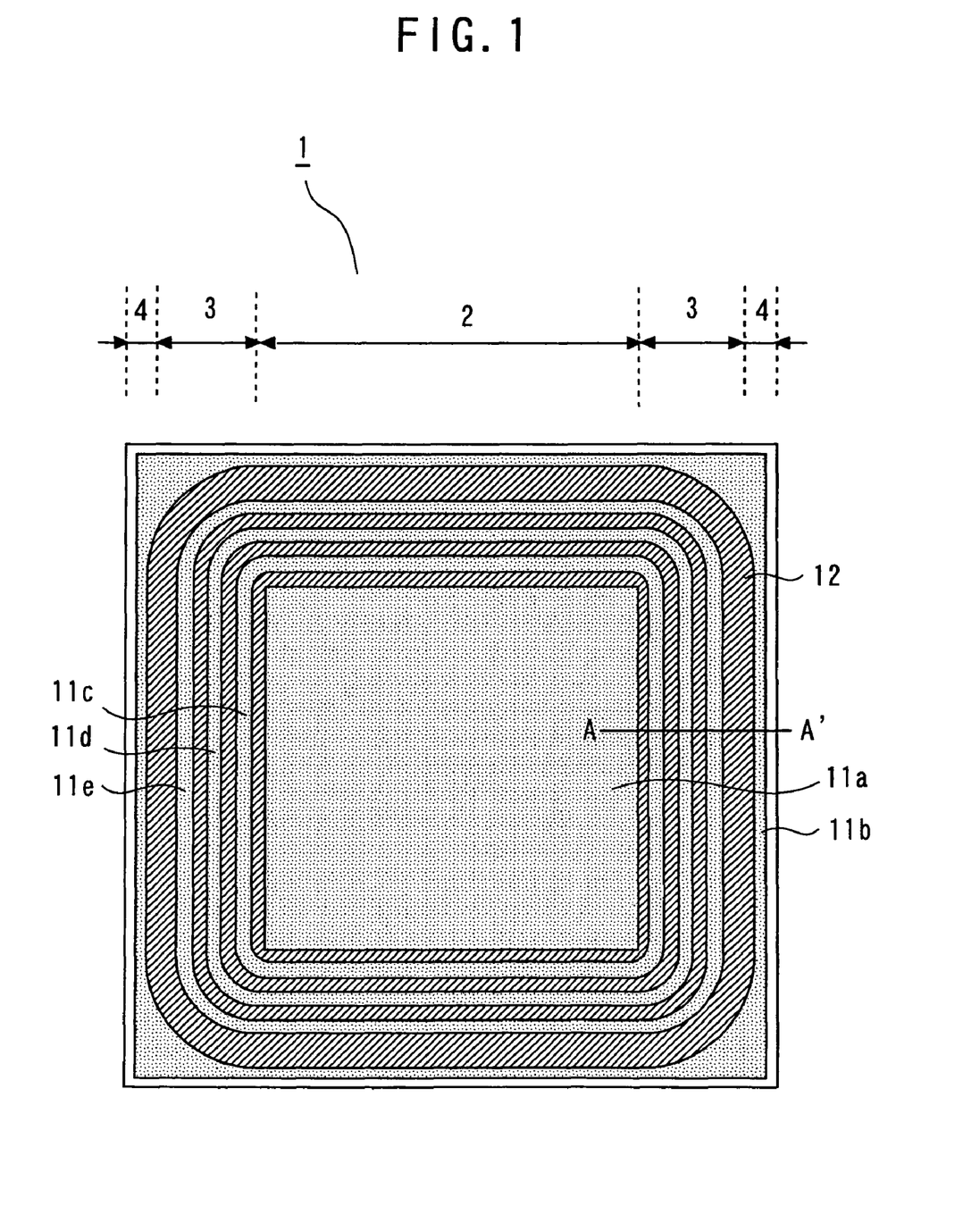
FIG. 1 is a plane view from the above of the major surface of a semiconductor chip of the first embodiment.

A semiconductor device according to the first embodiment will be described. FIG. 1 is a plane view viewed from the above of the major surface of a semiconductor chip. On the center portion of the semiconductor chip 1, a device region (active region) 2 is formed. In the exterior of the device region 2, a guard ring region 3 having a plurality of guard rings is formed. Between the guard ring region 3 and the end of the semiconductor chip 1, a channel stopper region 4 is formed. Specifically, on the major surface of the semiconductor chip 1, a guard ring region 3 is formed so as to surround a device region 2, and a channel stopper region 4 is formed so as to surround the guard ring region 3.

Figure 2:
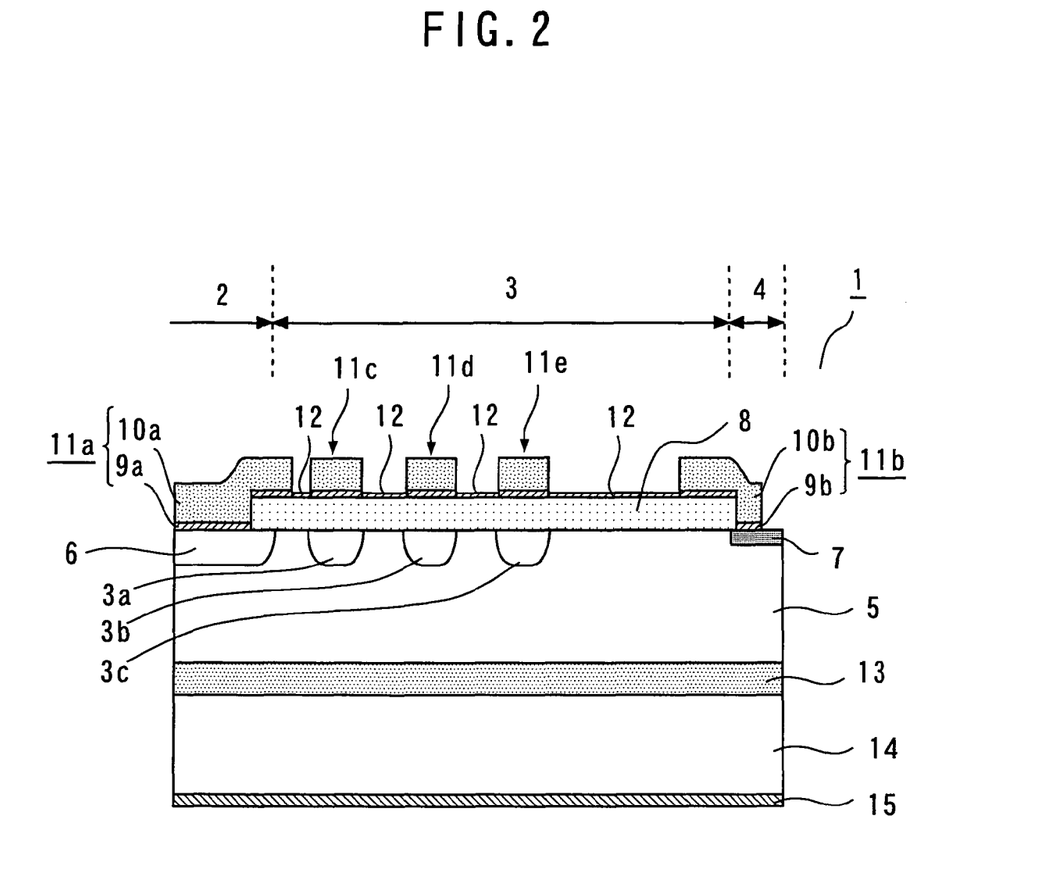
FIG. 2 is a cross sectional view of the semiconductor chip of the first embodiment.

FIG. 2 shows a sectional view along line A-A' in FIG. 1. The semiconductor chip 1 is formed using an n-type semiconductor (S1) substrate 5. On the first major surface (upper major surface) of the semiconductor substrate 5, the device region 2, the guard ring region 3, and the channel stopper region 4 are formed in the order from the internal portion of the semiconductor chip 1 toward the end portion.

In the device region 2, a p-type first diffusion layer 6 is formed on the first major surface of the semiconductor substrate 5. Over the first diffusion layer 6, a first surface electrode 11a is formed by stacking a high-melting-point metal film 9a, such as a Ti film, and an Al film 10a. The first surface electrode 11a is connected to the first diffusion layer 6.

In the guard ring region 3, p-type second diffusion layers 3a, 3b and 3c are formed apart from the first diffusion layer 6 toward the end portion of the semiconductor chip 1. When viewed from the above of first major surface of the semiconductor substrate 5, these second diffusion layers 3a, 3b and 3c are formed so as to circularly (ring-like) surround the device region 2. These diffusion layers form p-n junctions at the boundaries with the semiconductor substrate 5, and function as guard rings for maintaining high withstand voltage.

In the channel stopper region 4, an n-type third diffusion layer 7 is formed apart from the second diffusion layers 3a, 3b and 3c. On the third diffusion layer 7, a third surface electrode 11b is formed by stacking a high-melting-point metal film 9b, such as a Ti film, and an Al film 10b. The third surface electrode 11b is connected to the third diffusion layer 7.

The first surface electrode 11a is connected to the first diffusion layer 6, and the third surface electrode 11b is connected to the third diffusion layer 7. Such a surface electrode structure is a common structure in a semiconductor element having a shallow p-n junction, such as MOSFET (metal oxided semiconductor field effect transistor) and IGBT (insulated gate bipolar transistor). Although this description shows the semiconductor chip 1 when an IGBT is formed in the device region 2, it is effective to all the semiconductor elements that require high withstand voltage characteristics, including MOSFET. Therefore, detailed description for the device region 2 is omitted, and illustration is also simplified.

On the first major surface of the semiconductor substrate 5, an insulating film (e.g. $SiO_2$ film) 8 is formed so as to extend across the peripheral portion of the device region 2 (the right end of the device region 2 in FIG. 2), the guard ring region 3, and the inner circumferential portion of the channel stopper region 4 (the left end of the channel stopper region 4 in FIG. 2). Specifically, the insulating film 8 is formed on the semiconductor substrate 5 so as to coat the upper surfaces of second diffusion layers 3a, 3b and 3c; the end portion of the device region 2 side (left side) of the insulating film 8 contacts the first surface electrode 11a; and the end portion of the channel stopper region 4 side (right side) of the insulating film 8 contacts the third surface electrode 11b.

On the upper surface of the insulating film 8, second surface electrodes, 11c, 11d and 11e are formed so as to face the second diffusion layers 3a, 3b and 3c, respectively. Each of these electrodes has a structure formed by stacking an Al film on a high-melting-point metal film such as a Ti film as in the first surface electrode 11a and the third surface electrode 11b.

A conductive film 12 such as a Ti film is formed between the first surface electrode 11a and the second surface electrode 11c on the upper surface of the insulating film 8. Similarly, a conductive film 12 is also formed between the second surface electrodes 11c and 11d and between the second surface electrodes 11d and 11e on the upper surface of the insulating film 8. Specifically, on the upper surface of the insulating film 8, a conductive film 12 is formed between adjacent electrodes among the first surface electrode 11a and the second surface electrodes 11c, 11d and 11e.

Furthermore, on the upper surface of the insulating film 8, a conductive film 12 is also formed between the second surface electrode 11e and the third surface electrode 11b. Specifically, on the upper surface of the insulating film 8, a conductive film 12 is also formed between the second surface electrode 11e, which is closest to the third surface electrode 11b among the three second surface electrodes 11c, 11d and 11e, and the third surface electrode 11b.

On the other hand, on the second major surface of the semiconductor substrate 5, an n-type buffer layer 13 is formed, and so as to coat the n-type buffer layer 13, a p-type collector layer 14 and a p-type collector electrode 15 are formed.

In the first embodiment, a high-melting-point metal film such as a Ti film was used as the conductive film 12 formed on the insulating film 8. However, other than the Ti film, a TiN film, TiW film or the like can also be used as the conductive film. Furthermore, a stacked film containing any of the Ti film, TiN film and TiW film can also be used.

Here, a method for forming the conductive film 12 will be described. After forming a first diffusion layer 6, second diffusion layers 3a, 3b and 3c, and a third diffusion layer 7 have been formed on the first major surface of the semiconductor substrate 5, an insulating film 8 is formed. Next, on the entire first major surface of the semiconductor substrate 5, a Ti film and an Al film are sequentially formed.

Next, the Al film is selectively etched to expose the Ti film on the area where the Al film has been removed. Furthermore, the Ti film is etched by a predetermined thickness (half etching) leaving the Ti film on the surface of the insulating film 8 to form a conductive film 12 composed of the Ti film as shown in FIG. 2.

As a result, a first surface electrode 11a is formed over the first diffusion layer 6; second surface electrodes 11c, 11d and 11e are formed on the insulating film 8; and a third surface electrode 11b is formed on the third diffusion layer 7. At this time, on the insulating film 8, a conductive film 12 is formed between adjacent electrodes of these surface electrodes. The conductive film 12 is a film formed by the half etching of the Ti film. Therefore, the thickness of the conductive film 12 is thinner than the thickness of the lowermost metal film (Ti film) of the surface electrodes. Since the conductive film 12 is composed of Ti, which is a high-melting-point metal, it has a higher resistance than the resistance of the second surface electrodes 11c 11d and 11e having Al stacked thereon.

In general, when an electrode or wiring is formed, after a metal film is formed on the entire surface of a semiconductor substrate, the metal film other than that in the area used as the electrode or wiring is completely removed by etching or the like. Whereas in the first embodiment, only a high-resistance conductive film 12 of a predetermined thickness was left on the insulating film 8 between adjacent electrodes of a first surface electrode 11a, second surface electrodes 11c, 11d and 11e, and a third surface electrode 11b.

By the above-described structure, when an electric field of reverse bias is applied to the p-n junction at the boundary between second diffusion layers 3a, 3b and 3c, and the n-type semiconductor substrate 5, the extension of the depletion layer is assisted in the portion of the semiconductor substrate 5 under the conductive film 12. Therefore, compared with the case without the conductive film 12, the withstand voltage of the p-n junction can be elevated.

The conductive film 12 can be easily formed by half etching in the step for forming the first surface electrode 11a, second surface electrodes 11c, 11d and 11e, and the third surface electrode 11b. Therefore, a high withstand voltage can be achieved without complicating the entire manufacturing process. Specifically, according to the first embodiment, the area of the guard ring region 3 of the semiconductor chip can be reduced without complicating the entire manufacturing process. Therefore, since the chip size can be reduced while stably maintaining high withstand voltage properties, an inexpensive semiconductor device can be obtained.

In addition, since the conductive film 12 is a high-resistance layer containing a high-melting-point metal, such as Ti, it has a shielding effect against ionic (charging) substances or impurities from the exterior. Therefore, the manufacturing yield of semiconductor devices can be improved.

In the first embodiment, a Ti film was formed underneath the first surface electrode 11a, second surface electrodes 11c, 11d and 11e, and the third surface electrode 11b and an Al film is stacked on the Ti film, to provide a two-layer stacked structure. However, these surface electrodes can be multilayer metal film formed by stacking three or more different metal films. In this case, the lowermost metal film of the multilayer metal film is exposed on the area where surface metal layer has not been formed on the insulating film 8. Then, the lowermost metal film is left by only a predetermined thickness using the above-described half etching. As a result, the conductive film formed on the insulating film 8 can be formed as a film of the same material as the material of the lowermost metal film of the above-described surface electrodes (multilayer metal films).

In the first embodiment, although the semiconductor device was formed using an n-type semiconductor substrate 5, a structure wherein a p-type semiconductor substrate is used, and all the conductivity types of other components are reversed is also feasible. Even from such a structure, the same effect can be obtained.

In the first embodiment, three second diffusion layers $3a$, $3b$ and $3c$ were formed on the first major surface of the semiconductor substrate 5 as guard rings. However, the number of these diffusion layers can be one or more than one, and can be arbitrarily selected based on required withstand voltage properties in the semiconductor chip 1.

Second Embodiment

Figure 3:
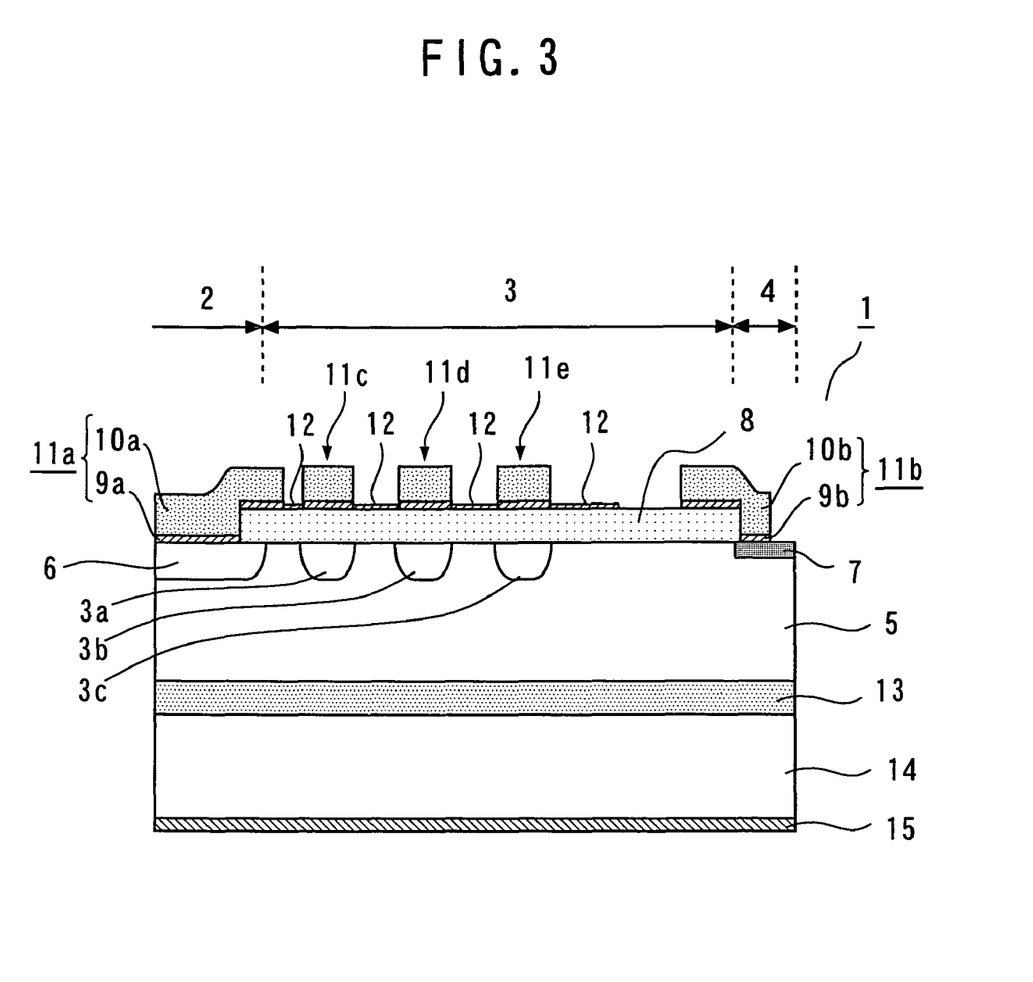
FIG. 3 is a cross sectional view of a semiconductor chip of the second embodiment.

A semiconductor device according to the second embodiment will be described referring to FIG. 3. Here, the description will be focused around different aspects from the first embodiment.

On an insulating film 8, a conductive film 12 extends from a second surface electrode $11e$ toward a third surface electrode $11b$ side, and terminates between the second surface electrode $11e$ and the third surface electrode $11b$. Specifically, on the insulating film 8, the conductive film 12 is confined to extend from the second surface electrode $11e$, which is closest to the third surface electrode $11b$ among three second surface electrodes $11c$, $11d$ and $11e$, to a predetermined location between the second surface electrode $11e$ and the third surface electrode $11b$, so as not to be connected to the third surface electrode $11b$. Other configurations are identical to those in the first embodiment.

By the above-described structure, the range where the depletion layer formed when a reverse bias voltage is supplied to the p-n junction can be confined to the range from the outermost guard ring, i.e. the second diffusion layer $3c$, to the above-described predetermined location between the second surface electrode $11e$ and the third surface electrode $11b$.

Thereby, variation in the extension of the depletion layer in the lateral direction can be minimized even if there is fluctuation of the resistivity of the semiconductor substrate 5, contamination by external negative ions or the like. Therefore, the stability of the withstand voltage of the semiconductor element can be improved.

Third Embodiment

A semiconductor device according to the third embodiment will be described referring to FIGS. 4 and 5. Here, the description will be focused around different aspects from the first and second embodiments.

Figure 4:
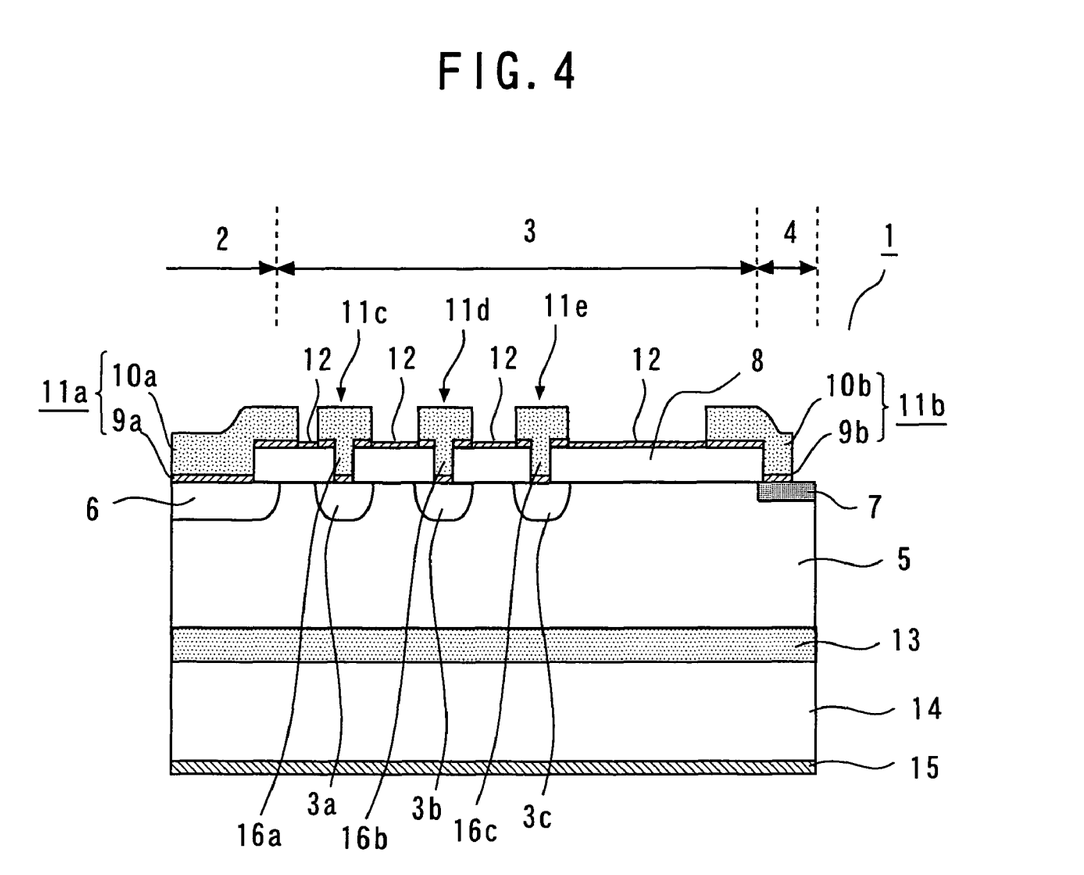
FIGS. 4 and 5 are cross sectional views of a semiconductor chip of the third embodiment.
Figure 5:
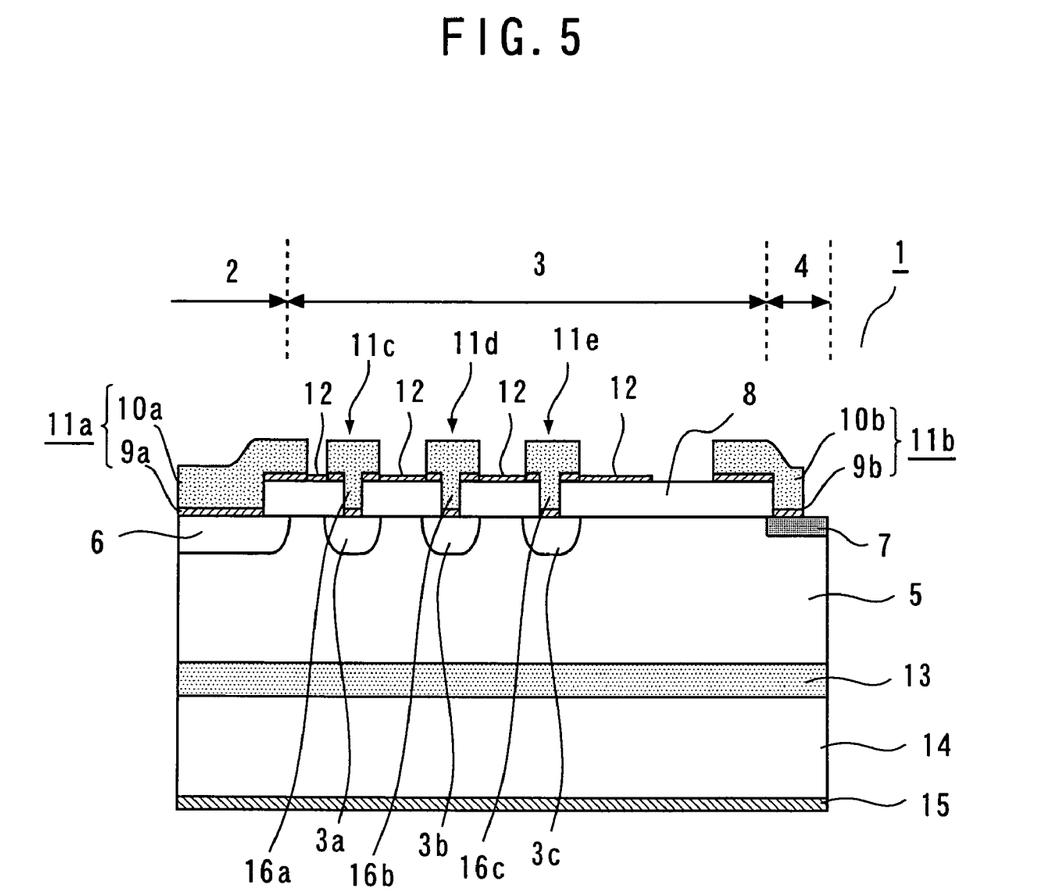

As FIG. 4 shows, an opening is formed on each of the second diffusion layers $3a$, $3b$ and $3c$ of the insulating film 8, and a Ti film and an Al film are buried in the opening. By these metal films, the second diffusion layers $3a$, $3b$ and $3c$ are connected to the second surface electrodes $11c$, $11d$ and $11e$, respectively.

Specifically, conductive connecting portions (contacts) $16a$, $16b$ and $16c$ are formed on the second diffusion layers $3a$, $3b$ and $3c$ in the insulating film 8, respectively. By these contacts, the second diffusion layers $3a$, $3b$ and $3c$ are electrically connected to the second surface electrodes $11c$, $11d$ and $11e$, respectively. Other configurations are identical to those in the first embodiment.

By the above-described structure, the potentials of the second diffusion layers $3a$, $3b$ and $3c$ can be made to be the same potentials as the second surface electrodes $11c$, $11d$ and $11e$, respectively. Thereby, the stability of the withstand voltage of the semiconductor element can be more improved than the first embodiment.

In addition, the structure shown in the second embodiment (refer to FIG. 3) can have the above-described contacts. Specifically, as FIG. 5 shows, the structure wherein the second diffusion layers $3a$, $3b$ and $3c$ are connected to the second surface electrodes $11c$, $11d$ and $11e$ through the contacts $16a$, $16b$ and $16c$, respectively, is also feasible. Thereby, the stability of the withstand voltage of the semiconductor element can be more improved than the second embodiment.

Fourth Embodiment

A semiconductor device according to the fourth embodiment will be described referring to FIG. 6. Here, the description will be focused around different aspects from the first to third embodiments.

Figure 6:
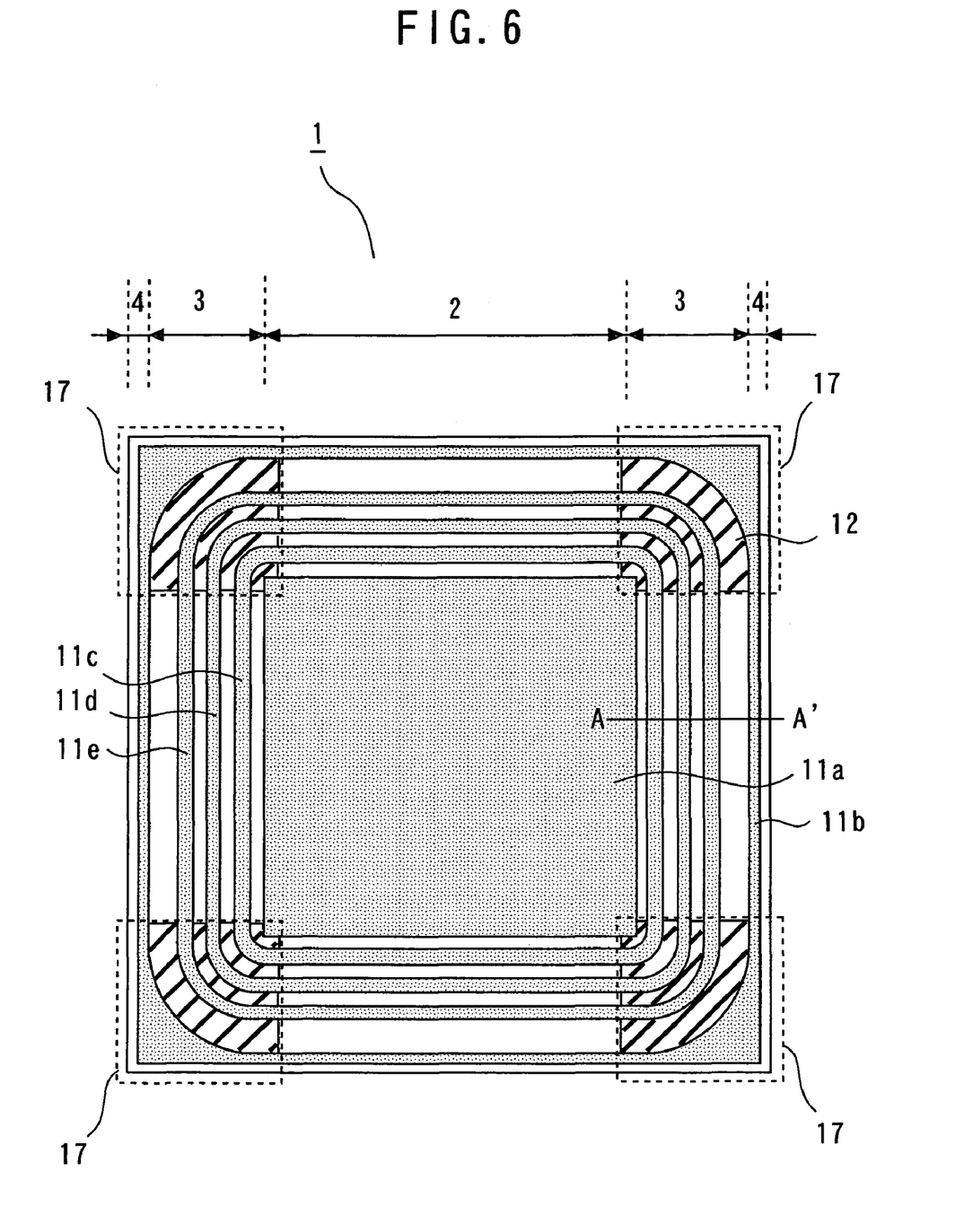
FIG. 6 is a plane view from the above of the major surface of a semiconductor chip of the fourth embodiment.

FIG. 6 shows a plane view of a semiconductor device according to the fourth embodiment viewed from the above of the first major surface thereof. The semiconductor device according to the fourth embodiment has a structure wherein a conductive film 12 is selectively formed on each corner portion 17 of a square semiconductor chip 1 in the semiconductor device shown in any of the embodiments 1 to 3. Specifically, conductive films 12 formed on the insulating film 8 are selectively formed on the corner portions 17 of the semiconductor chip 1. Other configurations are identical to those in the first to third embodiments.

When the semiconductor chip 1 is square as FIG. 6 shows, or of a shape having corner portions such as a rectangle (not shown), corner portions are also produced in a depletion layer formed along the guard ring region. Since electric fields are concentrated in such corner portions, withstand voltage becomes relatively lower than the withstand voltage in other portions. In the fourth embodiment, the stability of withstand voltage in corner portions can be improved by the structure shown in FIG. 6.

According to the fourth embodiment, the fluctuation of withstand voltage in the entire semiconductor chip 1 can be reduced by improving the withstand voltage in the corner portions where withstand voltage is relatively low in the semiconductor chip. That is, the entire chip has a good balance of withstand voltage, increasing the reliability of the semiconductor chip can be elevated.

In the fourth embodiment, examples wherein the semiconductor chips are square or rectangular were shown. However, the same effect can be also available from polygonal, such as octagonal semiconductor chips. Specifically, the same effect can be obtained as long as the semiconductor chip has corner portions. Furthermore, the fourth embodiment is not limited to an IGBT, but is effective to all the semiconductor elements that require high withstand voltage properties, including MOSFET or diodes.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2006-150986, filed on May 31, 2006 including specification, claims, drawings and summary, on which the Convention priority of the present application is based, are incorporated herein by reference in its entirety.

The invention claimed is:

1. A semiconductor device comprising:
   a semiconductor substrate of a first conductivity type;
   a device region formed on a major surface of the semiconductor substrate;

a guard ring region formed on the major surface of the semiconductor substrate, and surrounding the device region;

a first diffusion layer of a second conductivity type formed in the device region;

a first electrode formed over the first diffusion layer, and connected to the first diffusion layer;

at least one second diffusion layer of the second conductivity type formed in the guard ring region apart from the first diffusion layer, and surrounding the device region;

an insulating film, whose one end contacts the first electrode, coating the upper surface of the second diffusion layer in the guard ring region on the semiconductor substrate;

at least one second electrode facing the at least one second diffusion layer, formed on an upper surface of the insulating film, whereby the at least one second electrode is insulated from the second diffusion layer by the insulating film; and a conductive film integrally formed across the upper surface of the insulating film between and in contact with the electrodes thereby electrically connecting the electrodes to each other.

2. The semiconductor device according to claim 1, wherein:

a channel stopper region surrounding the guard ring region is formed on the major surface of the semiconductor substrate;

a third diffusion layer of the first conductivity type apart from the second diffusion layer is formed in the channel stopper region;

a third electrode connected to the third diffusion layer is formed on the third diffusion layer;

the third electrode contacts an other end of the insulating film; and the conductive film is also formed on the upper surface of the insulating film between the second electrode closest to the third electrode and the third electrode.

3. The semiconductor device according to claim 2, wherein the resistance of the conductive film formed on the insulating film is higher than the resistance of the second electrode.

4. The semiconductor device according to claim 1, wherein:

a channel stopper region surrounding the guard ring region is formed on the major surface of the semiconductor substrate;

a third diffusion layer of the first conductivity type apart from the second diffusion layer is formed in the channel stopper region;

a third electrode connected to the third diffusion layer is formed on the third diffusion layer;

the third electrode contacts the other end of the insulating film; and the conductive film extends on the upper surface of the insulating film from the second electrode closest to the third electrode to a predetermined location between the second electrode and the third electrode.

5. The semiconductor device according to claim 1, wherein the resistance of the conductive film formed on the insulating film is higher than the resistance of the second electrode.

6. The semiconductor device according to claim 4, wherein the resistance of the conductive film formed on the insulating film is higher than the resistance of the second electrode.

7. The semiconductor device according to claim 1, wherein:

the second electrode is a film formed by stacking a plurality of different metal film layers; and the conductive film formed on the insulating film is a film formed of the same material as the metal film of the lowermost layer of the second electrode.

8. The semiconductor device according to claim 7, wherein the thickness of the conductive film formed on said insulating film is thinner than the metal film of the lowermost layer of the second electrode.

9. The semiconductor device according to claim 1, wherein the conductive film formed on the insulating film contains any of Ti, TiN or TiW.

10. The semiconductor device according to claim 1, wherein:

a conductive connecting portion is formed on the second diffusion layer in said insulating film, and the second diffusion layer is electrically connected to the second electrode by the connecting portion.

11. The semiconductor device according to claim 1, wherein:

the semiconductor device is a square or rectangular semiconductor chip, and the conductive film formed on the insulating film is selectively formed on the corner portion of the semiconductor chip.

* * * * *